(12) United States Patent
Pulvirenti et al.

(10) Patent No.: US 6,303,964 B1
(45) Date of Patent: Oct. 16, 2001

(54) CIRCUIT DEVICE FOR PROTECTION AGAINST ELECTROSTATIC DISCHARGE, IMMUNE TO THE LATCH-UP PHENOMENON

(75) Inventors: Francesco Pulvirenti, Acireale; Enrico Ravanelli, Monza, both of (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/392,707

(22) Filed: Sep. 9, 1999

(30) Foreign Application Priority Data

Sep. 14, 1998 (IT) .............................. MI98A2003

(51) Int. Cl.[7] .............................. H01L 29/78; H01L 33/00
(52) U.S. Cl. .......................................... 257/355; 257/111
(58) Field of Search ...................................... 257/355, 111

(56) References Cited

U.S. PATENT DOCUMENTS 5,850,094 * 12/1998 Kato et al. ..
5,929,506 * 7/1999 Hutter et al. ..
6,236,088 * 5/2001 Nielson et al. ..

* cited by examiner

Primary Examiner—Stephen D. Meier
(74) Attorney, Agent, or Firm—Theodore E. Galanthay; Allen, Dyer, Doppelt, Milbrath & Gilchrist, P.A.

(57) ABSTRACT

The present invention relates to a circuit device for protection against electrostatic discharge, and being immune to the latch-up phenomenon. The circuit device is of the integrated type in a portion of a semiconductor integrated circuit. The device includes an active limiting element and a resistor connected in series between a terminal of the active element connected to an input/output pin of the integrated circuit, and a terminal of a circuit to be protected. The active element is a bipolar transistor having a base terminal and an emitter-acting collector terminal connected together. The distributed resistor is formed in an emitter-acting collector region of the transistor which is diffused and elongated at the surface inside a base pocket of the transistor.

14 Claims, 3 Drawing Sheets

CIRCUIT DEVICE FOR PROTECTION AGAINST ELECTROSTATIC DISCHARGE, IMMUNE TO THE LATCH-UP PHENOMENON

FIELD OF THE INVENTION

This invention relates to the field of integrated circuits, and, more particularly, to the protection against electrostatic discharge in integrated circuits.

BACKGROUND OF THE INVENTION

Damage from electrostatic discharge (ESD) represents a significant cause of failure, with today's integrated circuits, especially in view of the continual trend of integrated circuits toward submicron physical dimensions. From the electrical standpoint, an ESD event occurs upon one or more of an integrated circuit terminals coming in contact with an object which is charged statically to a high voltage (which may be on an order of thousands of Volts). Upon such a contact, an integrated circuit would discharge the charged object through its active devices and DC paths. If the amount of the charge is too large, however, the density of the discharge current can damage the integrated circuit to the point of impairing its operability, or making it prone to fail later. Damage from ESD becomes, therefore, a cause of losses in production output as well as of decreased reliability in use.

It is common practice in the industry to provide integrated circuits individually with ESD protection devices connected to the circuit external pins. ESD protectors are designed to provide a current path of sufficient capacity to safely discharge a charge applied thereto by a charged object when an ESD event occurs, but without inhibiting the functionality of the integrated circuit in normal operation. The addition of ESD protectors unavoidably involves parasitic effects which lower the circuit performance. In such cases as when series resistors are used, ESD protectors directly introduce additional delay in the electrical performance. Consequently, a desirable objective of ESD protection devices should be to provide a high capacity current path which can be readily brought to act during an ESD event, but never during normal operation, and has minimal effects on the circuit performance.

One example of a conventional ESD protection device for bipolar integrated circuits is described in Avery, "Using SCR's as Transient Protection Structures in Integrated Circuits", *Electrical Overstress/Electrostatic Discharge Symposium Proceedings*, (IIT Research Institute, 1983), pages 177–180. The protection device described therein is a vertical SCR (Silicon Controlled Rectifier). As is known, SCRs are capable of conveying relatively large amounts of current with relatively small resistance, especially if arranged to operate in their snap-back or "negative resistance" state.

In this specific field, a phenomenon associated with the turning on of a parasitic SCR structure, e.g. of PNPN or BJT type, is known as "latch-up" and causes an uncontrolled flow of current between two regions of a semiconductor integrated circuit. These regions may be a P+/Nwell (or P+/Nepi) junction connected to a supply voltage reference Vdd, and an N+/Pwell (or Nepi/Pwell) junction connected to a second voltage reference such as ground, respectively. The effect is regenerative and the latch-up cannot be suppressed by removing its cause, but only by cutting off the supply to the device.

As previously mentioned, electronic devices integrated in a semiconductor can be accessed from outside through contact pins, and the pins which are most affected by the latch-up phenomenon are the digital signal input and output pins. This is due to the most common cause of latch-up being a voltage discharge or spike that brings the pin affected by the phenomenon to a lower potential than the ground value, or a higher potential than the supply voltage Vdd.

Known are, in this respect, ESD protection structures adapted to protect the pins wherewith they are associated by either a conduction path triggering the latch-up phenomenon, a voltage pulse below the ground value, or a voltage pulse above the supply value. On this account, certain auxiliary barriers are added to the ESD protectors in order to reduce the triggering threshold of the parasitic SCR structure to a minimum.

The most efficient ESD protection structure currently provided by the state of the art, and commonly used for protecting low-voltage pins against electrostatic discharge of positive and negative signs, is illustrated by FIG. 1. This structure basically includes an active limiting element PD which mostly comprises a lateral bipolar transistor of the NPN type or a base-emitter transistor; and a resistor R connected in series between the input/output pin (I/O) and a circuit to be protected. This P-type resistor is usually formed in a pocket or well of the N conductivity type connected to the pin. Shown schematically in the accompanying FIG. 2 is a detailed view of the physical construction of an ESD protector with a lateral NPN transistor.

On the other hand, FIG. 3 schematically shows a detailed view of the physical construction of an ESD protector with a base-emitter transistor, that is a transistor connected in a diode configuration and having its base and emitter terminals connected together. The circuit device of FIG. 1 has applications to both the protection of input pins, with the resistor R being in the 2 to 5 k ΩW range, and the protection of output pins, with the resistor R being less than a few hundred Ohms and sometimes zero Ohms.

FIG. 4 schematically shows the construction of the ESD protector of FIG. 1, comprising a protection transistor of the base-emitter transistor type and a resistor of the P conductivity type formed of an epitaxial N pocket connected to the pin to be protected. As previously mentioned, the peculiar construction of the active protection element PD and the pocket bias of R make this type of protection highly prone to latch-up.

However, there is no alternative solution currently available whereby the pocket of the resistor R can be biased such that the protector will be at one time efficient and free from parasitic paths in any possible applications. In fact, where a lateral transistor is provided, the parasitic SCR structure would be triggered on by a negative voltage discharge driving the resistor and the protector pockets to less than ground potential However, this arrangement would be immune to positive voltage discharge.

In addition, where the circuit to be protected is, for example, a CMOS buffer stage, the resistor R could be omitted, so that the parasitic SCR structure would be triggered on by both a negative voltage discharge, as in the previous instance, and a positive voltage discharge turning on a diode intrinsic to a P-channel transistor incorporated to the buffer stage to be protected.

SUMMARY OF THE INVENTION

An object of this invention is to provide a circuit device for ESD protection, which exhibits such structural and functional features as to be immune to the latch-up phenomenon, regardless of the type of the circuit to be protected. The device of this invention should also be suitable to protect digital or low voltage integrated circuit pins.

Another object of the invention is to provide a protection device structure based on the base-emitter transistor but having a series resistor formed by an extension of the collector region functioning as the transistor emitter and being diffused directly into the transistor base pocket.

More particularly, but not exclusively, the invention is directed to a protection device against electrostatic discharge which is immune to the latch-up phenomenon that usually affects conventional protection structures. The protection device is of a type integrated in a portion of a semiconductor integrated circuit, and includes an active limiting element and a resistor. The resistor is connected in series between a terminal of the active element, in turn connected to an input/output pin of the integrated circuit, and a terminal of a circuit to be protected.

In this way, no problems from latch-up triggering will arise, since the terminal which is connected to the integrated circuit pin is led to a diffused region inside the base region of the protection transistor

DETAILED DESCRIPTION OF THE PREFERRED EMBODIMENT

Figure 5:
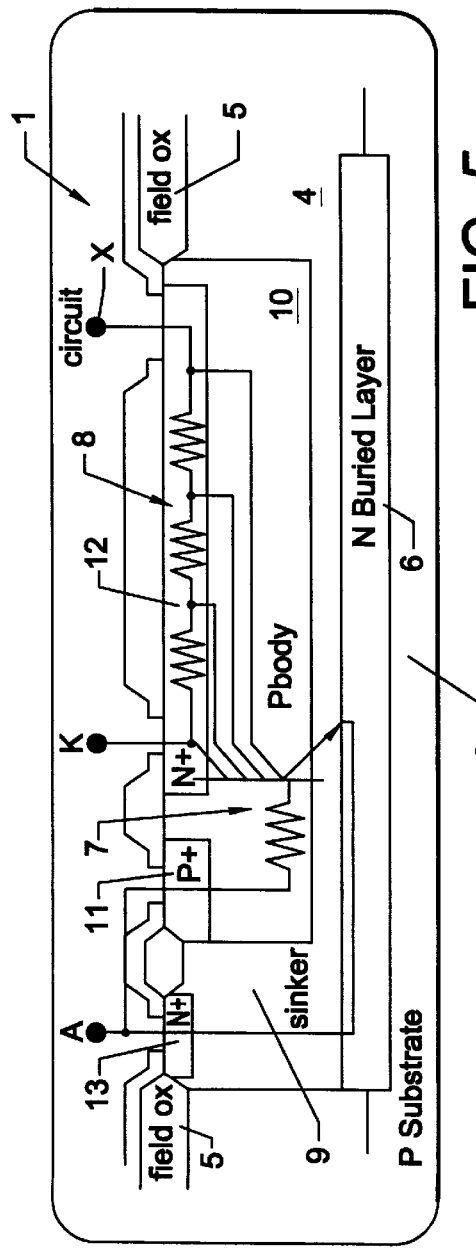
FIG. 5 is a schematic view of an ESD protection device according to the present invention.

With specific reference to FIG. 5, shown generally and schematically at 1 is a circuit device according to this invention, intended for providing circuits connected thereto with protection against electrostatic discharge. Further, the device 1 is immune to the latch-up phenomenon.

The device 1 is formed within a circuit integrated in a semiconductor, from a semiconductor substrate 3 which is lightly doped with dopant of a first type, e.g. of the P conductivity type. The substrate 3 is overlaid with an epitaxial layer 4 which is lightly doped with dopant of a second conductivity type. The device 1 is formed in a semiconductor portion which is surface isolated from opposite field oxide insulating regions 5. Provided within this semiconductor portion between the substrate 3 and the epitaxial layer 4, is a buried layer 6 which is doped with the second N conductivity type of dopant.

The device 1 has an active limiting element 7, e.g. including a bipolar base-emitter transistor of the NPN type, and a distributed resistor 8 formed by an N+ conductivity type of diffusion. The BJP transistor "pulls" a current from the body of the distributed resistor 8, micron by micron. This distributed resistor 8 is connected between a terminal K (cathode), itself connected to an input/output pin of the integrated circuit, and a node X of a circuit to be protected which is incorporated to the integrated circuit. The base-emitter transistor 7 has its terminals of base and emitter-acting collector connected together.

In particular, the emitter-acting collector region of the transistor 7 corresponds to the buried layer 6 and the epitaxial region 4. A contact region 13 of the N+ conductivity type is formed at the surface of the semiconductor portion and connected to the buried layer 6 through a deep connection diffusion 9. The contact region 13 is connected to a terminal A (anode).

A P-doped surface pocket or well 10 is formed above the buried layer 6 but is isolated therefrom. This pocket 10 has an inherent resistance R and represents the base region of the transistor 7. Provided inside this pocket 10, at the periphery thereof, is a P+ doped region 11 which represents a contact for the base region of the transistor 7. This region 11 is connected to the terminal A. Advantageously, an extended diffusion region 12 is formed at the pocket 10 surface. This extended region 12 is doped N+ and completely surrounded by the pocket 10. The region 12 represents the emitter-acting collector of the transistor 7, as well as the distributed resistor 8 connected between this emitter-acting collector and the circuit to be protected.

Advantageously in this invention, the distributed resistor 8 is formed of an extension of the emitter-acting collector region 12 of the transistor 7 which is also diffused directly into the base pocket 10 of the transistor 7. Thus, the device of this invention shows no problems from the triggering of the latch-up phenomenon, since the node K connected to the integrated circuit pin is led to an N+ diffusion 12 already provided inside a base pocket 10. Furthermore, the problem of correctly biasing the series resistor is removed.

In addition, the device 1 is favorable to the turning on of auxiliary emitter-acting collectors which, by pulling current from the distributed resistor 8 into the base region 10, will limit and further lower the voltage at the node X connected to the circuit to be protected This results in a stronger ESD protection than prior solutions.

Figure 1:
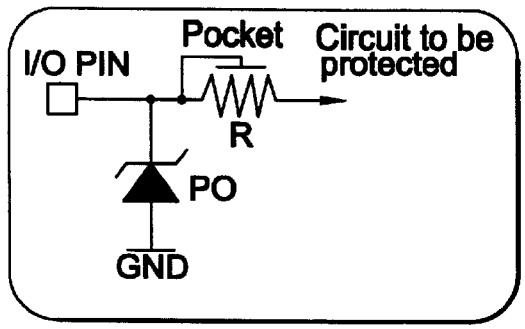
FIG. 1 schematically shows an ESD protection structure according to the prior art.
Figure 6:
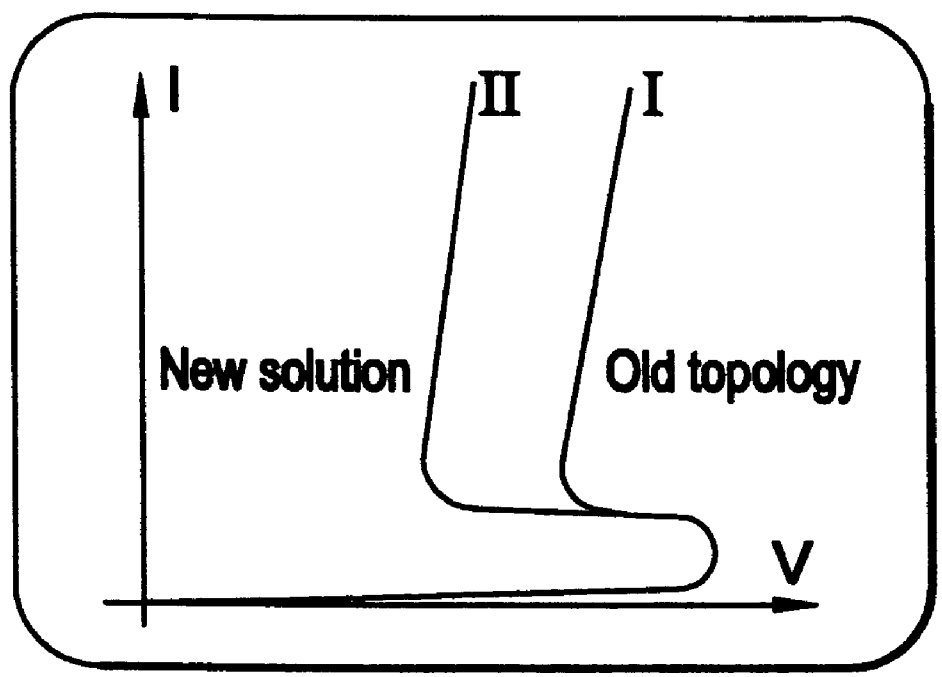
FIG. 6 is a graph showing comparative plots of the voltage-current characteristics of a conventional protection device and the device of the present invention, respectively.

FIG. 6 shows the qualitative evolution of the voltage-current characteristic of the node X relative to the circuit to be protected against electrostatic discharge Curve I relates to a prior art protection device, such as that shown in FIG. 1, and curve II relates to the device of this invention.

It can be appreciated that, with the solution proposed by this invention, the voltage at the node X to be protected is limited to lower values than a comparable prior art solution. This is beneficial to an improved circuit protection.

That which is claimed is:

1. A device for protection of an integrated circuit against electrostatic discharge, the integrated circuit having an input/output pin, the device comprising:

a bipolar transistor having a base terminal and an emitter-acting collector terminal connected together, and having a base well with an emitter-acting collector region therein, the emitter-acting collector region having a terminal connected to the input/output pin of the integrated circuit; and a distributed resistor connected in series between the emitter-acting collector region terminal of the bipolar transistor and a node of the integrated circuit to be protected, the distributed resistor being disposed within the emitter-acting collector region of the bipolar transistor.

2. A device according to claim 1, wherein the emitter-acting collector region comprises an extended diffused region provided at a surface of the base well.

3. A device according to claim 2, wherein the extended diffused region is of the N+ conductivity type.

4. A device according to claim 1, wherein the distributed resistor comprises a diffused region of the N+ conductivity type.

5. A device according to claim 1, wherein the emitter-acting collector region comprises a distributed collector of the bipolar transistor having plural points of connection to the distributed resistor within the emitter-acting collector region.

6. A device according to claim 1, wherein the emitter-acting collector region includes two opposite ends, wherein the emitter-acting collector region terminal is connected to the input/output pin being at one end, and wherein the other end is connected to the node of the integrated circuit to be protected.

7. A device according to claim 1, wherein the emitter-acting collector region is elongated for accommodating the distributed resistor.

8. An integrated circuit comprising:

an input/output pin;

node; and an electrostatic discharge protection device comprising
   a bipolar transistor having a base terminal and an emitter-acting collector terminal connected together, and having a base well with an emitter-acting collector region therein, the emitter-acting collector region having a terminal connected to the input/output pin; and
   a distributed resistor connected in series between the emitter-acting collector region terminal of the bipolar transistor and the node, the distributed resistor being disposed within the emitter-acting collector region of the bipolar transistor.

9. An integrated circuit according to claim 8, wherein the emitter-acting collector region comprises an extended diffused region provided at a surface of the base well.

10. An integrated circuit according to claim 9, wherein the extended diffused region is of the N+ conductivity type.

11. An integrated circuit according to claim 8, wherein the resistor comprises a diffused region of the N+ conductivity type.

12. An integrated circuit according to claim 8; wherein the emitter-acting collector region comprises a distributed collector of the bipolar transistor having plural points of connection to the distributed resistor within the emitter-acting collector region.

13. An integrated circuit according to claim 8, wherein the emitter-actinq collector region includes two opposite ends, wherein the emitter-acting collector region terminal connected to the input/output pin is at one end, and wherein the other end is connected to the node.

14. An integrated circuit according to claim 8, wherein the emitter-acting collector region is elongated for accommodating the distributed resistor.

* * * * *

UNITED STATES PATENT AND TRADEMARK OFFICE
CERTIFICATE OF CORRECTION

PATENT NO. : 6,303,964 B1  
DATED : October 16, 2001  
INVENTOR(S) : Francesco Pulvirenti and Enrico Ravanelli Page 1 of 2

It is certified that error appears in the above-identified patent and that said Letters Patent is hereby corrected as shown below:

<u>Drawings,</u>
FIG. 1, delete "FIG. 1" insert -- new FIG. 1 --

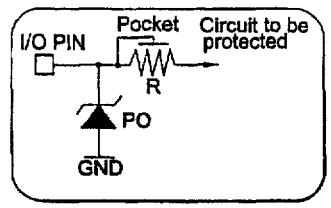

FIG. 1.
*(PRIOR ART)*

Figure 2:
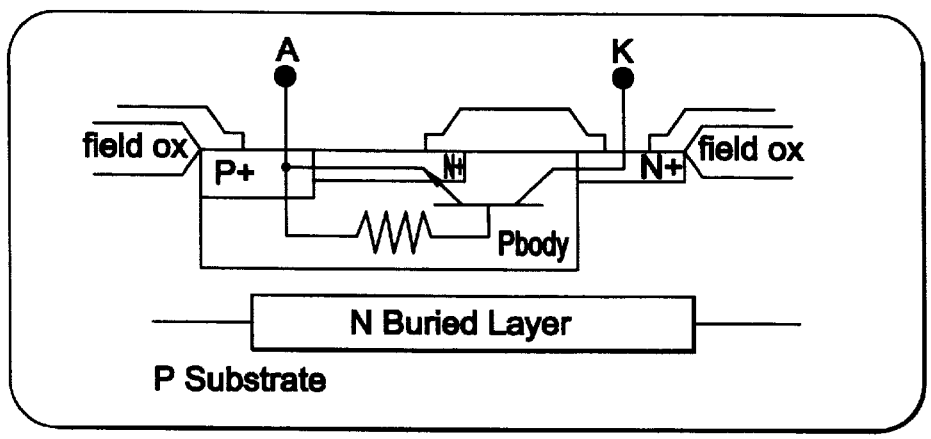
FIG. 2 schematically shows the physical construction of the ESD protection device of FIG. 1, incorporating a lateral NPN transistor.

FIG. 2, delete "FIG. 2" insert -- new FIG. 2 --

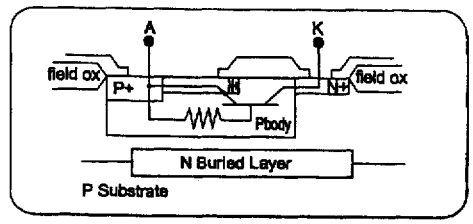

FIG. 2.
*(PRIOR ART)*

Figure 3:
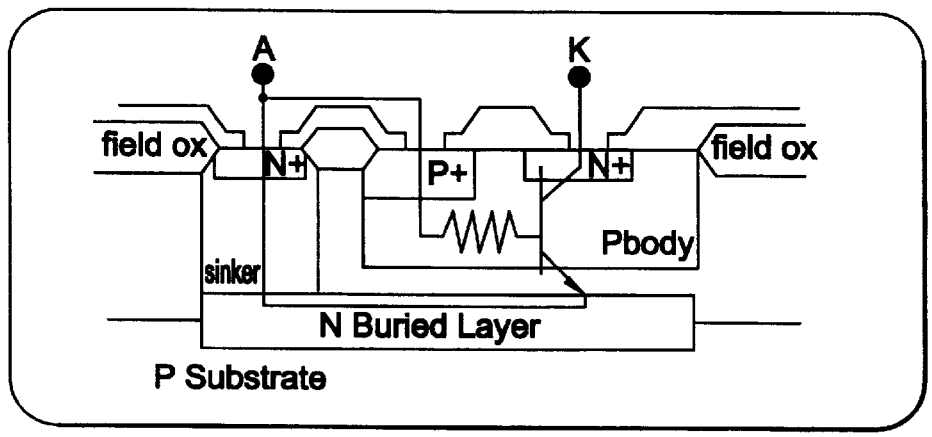
FIG. 3 schematically shows the physical construction of the ESD protection device of FIG. 1, incorporating a base-emitter transistor.

FIG. 3, delete "FIG. 3" insert -- new FIG. 3 --

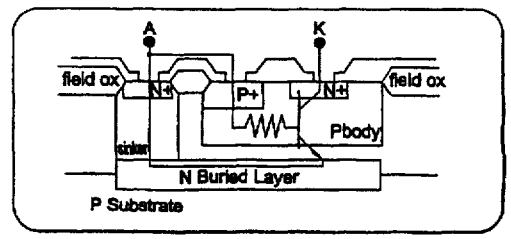

FIG. 3.
*(PRIOR ART)*

UNITED STATES PATENT AND TRADEMARK OFFICE
CERTIFICATE OF CORRECTION

Figure 4:
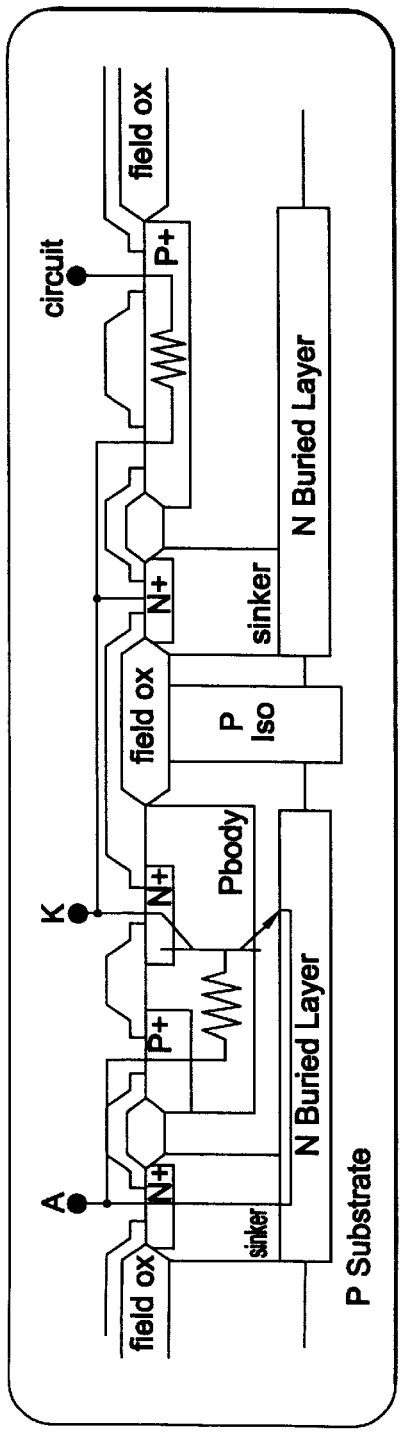
FIG. 4 schematically shows the physical construction of the ESD protection device of FIG. 1, incorporating a base-emitter transistor.

PATENT NO. : 6,303,964 B1
DATED : October 16, 2001
INVENTOR(S) : Francesco Pulvirenti and Enrico Ravanelli It is certified that error appears in the above-identified patent and that said Letters Patent is hereby corrected as shown below:

FIG. 4, delete "FIG. 4" insert -- new FIG. 4 --

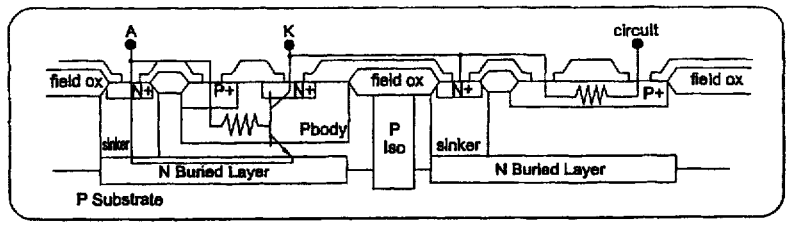

FIG. 4.
(PRIOR ART)

Column 4,
Line 45, delete "discharge Curve" insert -- discharge. Curve --

Column 5,
Line 25, delete "node; and" insert -- a node; and --

Column 6,
Line 23, delete "emitter-actinq" insert -- emitter-acting --

Signed and Sealed this

Fourteenth Day of May, 2002

Attest:

Attesting Officer

JAMES E. ROGAN
Director of the United States Patent and Trademark Office